US008670947B2

(12) United States Patent
Prasanth et al.

(10) Patent No.: US 8,670,947 B2
(45) Date of Patent: Mar. 11, 2014

(54) COMPUTER SYSTEM FOR AUTOMATICALLY DETERMINING SLEW RATE DE-RATING VALUES

(75) Inventors: G. R. N. Prasanth, Bangalore (IN); Pechluck Pongched, Portland, OR (US); Raghavendran N., Bangalore (IN); Mark L. Guenther, Portland, OR (US); Krishna N. H. Sri, Bangalore (IN); Manisha D. Ajgaonkar, Bangalore (IN); Anuradha V., Bangalore (IN)

(73) Assignee: Tektronix, Inc., Beaverton, OR (US)

( * ) Notice: Subject to any disclaimer, the term of this patent is extended or adjusted under 35 U.S.C. 154(b) by 570 days.

(21) Appl. No.: 12/771,977

(22) Filed: Apr. 30, 2010

(65) Prior Publication Data

US 2011/0119688 A1 May 19, 2011

(30) Foreign Application Priority Data

May 15, 2009 (IN) .......................... 1255/MUM/2009
Sep. 30, 2009 (IN) .......................... 1254/MUM/2009

(51) Int. Cl.
*G01R 29/02* (2006.01)
(52) U.S. Cl.
USPC ............... 702/79; 702/57; 702/69; 702/89; 702/119; 719/328; 708/200
(58) Field of Classification Search
USPC ............... 702/57, 66, 69, 79, 89, 119, 189; 708/200; 719/328
See application file for complete search history.

(56) References Cited

U.S. PATENT DOCUMENTS 7,428,717 B1 9/2008 Duong
2009/0238012 A1 * 9/2009 Tatapudi et al. ....... 365/189.011

OTHER PUBLICATIONS

McKinney, S. Successful DDR2 Design. Memory Interfaces Solution Guide [online], Mar. 2006 [retrieved on Nov. 8, 2012]. Retrieved from the Internet: <URL: http://www.xilinx.com/publications/archives/solution_guides/memory_interfaces.pdf>.*
Murray, P.,and Al-Hawari, F. Challenges in Implementing DDR3 Memory Interface on PCB Systems. DesignCon 2008 [online], Feb. 2008 [retrieved on Nov. 8, 2012]. Retrieved from the Internet: <URL: http://www.cdnusers.org/community/allegro/Resources/kits_designin/memory/stp_designcon08_DDR3Altera.pdf>.*
Gary L. Pratt P E ED—Anonymous: "Automated Timing and Electrical Analysis of a DDR2 Memory Interface", Electrical Performance of Electronic Packaging, IEEE, PI, Oct. 1, 2006, pp. 103-106, XP031052820 ISBN: 978-1-4244-0668-5.
Vollrath J. et al: "DDR2 DRAM Output Timing Optimization" Memory Technology, Design, and Testing, 2006. MTDT '06. 2006 IEEE International Workshop on Taipei, Taiwan Aug. 2-4, 2006, Piscataway, NJ, USA, IEEE LNKD-DOI: 10.1109/MTDT. Sep. 2006, Aug. 2, 2006, pp. 49-54, XP010934132 ISBN: 978-0-7695-2572-3.
Soujanna sarkar et al: "Design Margin Methodology for DDR Interface" Electrical Performance of Electronic Packaging, 2007 IEEE, IEEE, PI, Oct. 1, 2007, pp. 167-170, XP031163597 ISBN: 978-1-4244-0883-2.

* cited by examiner

*Primary Examiner* — Sujoy Kundu
*Assistant Examiner* — Paul D Lee
(74) *Attorney, Agent, or Firm* — Marger, Johnson & McCollom, P.C.; Thomas F. Lenihan (57) ABSTRACT

Embodiments of the invention provide a system and method to measure and represent the measured value of a limit in terms of another measurement, such as clock values or cycles of the system. The system can include, for example, a test and measurement instrument such as an oscilloscope. In another embodiment of the present invention, slew rate de-rated values may be automatically determined through the use of configurable lookup tables.

8 Claims, 6 Drawing Sheets

Figure 5c under the pdf title US 8,670,947 B2

COMPUTER SYSTEM FOR AUTOMATICALLY DETERMINING SLEW RATE DE-RATING VALUES

RELATED APPLICATION DATA

This application claims the benefit of Indian Patent Application Nos. 1254/MUM/2009, filed Sep. 30, 2009, claiming benefit of Indian provisional patent application Nos. 1254/MUM/2009, filed May 15, 2009, and 1255/MUM/2009 filed May 15, 2009, all herein incorporated by reference.

BACKGROUND

A. Technical Field

The present invention relates generally to oscilloscopes, and more particularly, to user interfaces, methods, and systems for measuring and representing values in signal measurement systems.

B. Background of the Invention

Double data rate (DDR) memory technology has become more prevalent in the marketplace, and includes the capability of clocking data on both rising and falling edges of a strobe signal in a memory interface. Similarly, the next generation DDR2 technology has provided an additional two-times improvement in bandwidth over its DDR predecessor by doubling the maximum clock frequency.

With any high-speed interface, as the operating frequencies increase, it becomes progressively more difficult to meet the signal integrity and timing requirements at the receivers. With tighter timing budgets, signals tend to deteriorate because faster edge rates are needed to meet them. As edge rates get faster, effects like overshoot, reflections, and crosstalk become more significant problems on the interface resulting in a negative impact on the timing budget. A significant change incorporated into next generations of DDR technology to counter the impact on the timing budget is signal slew rate de-rating for both data and address/command signals.

One challenging aspect of the memory interface designers is to meet the setup and hold time requirements of the receivers. The setup and hold time values vary depending on the input signal slew rate. In order to compute slew rate properly, a user needs to know how to measure signal slew rate, and how to make use of Joint Electron Device Engineering Council (JEDEC) specified de-rating tables.

In DDR2 technology, the typical definition for the setup and hold time for memory components is 1.0 Volt/nano-second (V/ns) input slew rate. By design, slew rate of a memory chip can be faster or slower. Accordingly, the setup and hold time requirements are changed, since the user cannot use the same slew rate of 1.0 V/ns. This discrepancy has led to the need for slew rate de-rating on the signals specific to user design.

Conventional attempts at solving these challenges implement a series of manual steps, including manual measurements, which are cumbersome and challenging to complete.

The following steps are an example of a typical approach. First, the slew rate on the input signal is measured. This is done by finding nominal slew rate of the signal in the transition region between the specified voltage levels. The nominal method and voltage levels are defined in the JEDEC DDR2 and DDR3 specifications. Second, a determination is made whether the region of interest of the signal needs to use the nominal or the tangent method. The tangent method is used if signal transition results in a slope greater than the nominal line at the switching region. Tangent method is also defined in the JEDEC DDR2 and DDR3 specifications. It is time consuming to detect the slopes and then decide on which method to use as the slope has to be calculated for each sample point from the reference level between the two voltage levels. According to the specification, it has to be ensured that the slope occurring due to tangent should be earlier than the nominal line.

Next, slew rate on both rise and fall slopes for all the acquired transitions is computed. The cycle-by-cycle slew should be calculated to know the worst case behavior of the device under test (DUT), which is tedious to perform on rise and fall slopes, particularly when the acquired signal duration is long enough to accommodate hundreds of cycles. Meanwhile, the correct relationship between the polarity of the de-rating value and the direction of margin impact must be maintained. Thereafter, the slew rate on two separate signals is computed. A user makes use of the two typical slew rate values to index the appropriate de-rating table. The JEDEC specifies different tables for the different speeds to obtain the delta value. Finally, the delta value is added to the limits taken from the data sheet of the base measurement, which represents the de-rated limits.

Thus, the designers of high speed communication technologies need to perform various and laborious calculations of the limits to understand the dynamic behavior of the system. Moreover, with the emergence of DDR memory technologies, the measurements which were static needed to be calculated over and over again by a designer to get a deeper understanding of the behavior of the system in hand. Further, such manual measurements are error prone.

Therefore, a need remains for an improved solution where a designer can easily carry out various calculations of the limits to understand the dynamic behavior of the system.

SUMMARY

Embodiments of the invention enable a designer to derive limits using another measured value, thereby providing dynamic and relative measurements so that the designer can more effectively design systems.

Some embodiments of the invention provide for the calculation of limits in terms of actual clock values or cycles, and also display the units as normalized clock values or cycles, as explained in further detail below.

Some embodiments enable a designer to automatically determine the slew rate de-rated values through the configurable lookup tables, as further discussed herein.

In accordance with various embodiments of the invention, a method and a system are provided for measuring and representing the measured value of a limit in terms of another measurement, and also for automatically determining slew rate de-rating values on the signals specific to user design by providing automatic and configurable de-rating tables.

In some embodiments, a master application layer may be developed for providing necessary infrastructure for a client application to plug-in the implementation for dynamic limits and units. Said master application layer sends required details to the client application. The client application makes limit calculations, and the values obtained after the limit calculations may be processed and represented in terms of another measurement. Thereafter, the said values may be sent back to the master application layer for display.

In some embodiments, slew rate de-rating values on the signals specific to user design may be determined by providing automatic and configurable de-rating tables, and the master application layer that supports measurements including but not limited to rise, fall slew rate, setup and hold and their related configurations, may be used for computing slew rate de-rating. This may be accomplished by the master application layer, which can automatically switch between nominal approach and tangent approach depending on the maximum slope when a user selects DDR method for determining the slew rate.

In various embodiments herein, the calculated de-rating limit value may be given as tDS(total setup time)=tDS(base)+ ΔtDS, where the data sheet limit value of tDS(base) may be added to (i.e., summed with) the ΔtDS de-rating value taken from the de-rating table.

In one embodiment herein, the master application layer may be a testing application layer that may store the de-rating table, which can be edited any time by a user. Also, the user can run multiple measurements with a 'single' button selection presented as part of the user interface of the application, which causes the system to perform the complicated and time consuming de-rated measurements accurately.

Other features and advantages of the invention will be apparent from the drawings, and from the detailed description that follows below.

BRIEF DESCRIPTION OF THE DRAWINGS

Reference will be made to embodiments of the invention, examples of which may be illustrated in the accompanying figures. These figures are intended to be illustrative, and are not limiting. Although the invention is generally described in the context of these embodiments, it should be understood that by doing so, it is not intended to limit the scope of the invention to these particular embodiments.

DETAILED DESCRIPTION OF THE PREFERRED EMBODIMENTS

The embodiments herein provide methods and systems to measure and represent the measured value of a limit in terms of clock values or cycles of the system. Also, the methods and systems taught herein enable a designer to automatically determine the slew rate de-rated values. Further, the embodiments may be easily implemented in various other technologies such as Peripheral Component Interconnect Express (PCIe), Universal Serial Bus (USB), etc. A method of the invention may also be implemented as computer software, hardware, firmware, or any combination thereof.

The invention described herein is explained using specific exemplary details to facilitate an understanding. However, the invention disclosed can be implemented by a person that is skilled in the art without the use of these specific details. The invention can be implemented into various types of digital storage oscilloscopes. Further, the invention may be implemented in hardware as well as software. Structures and devices shown in block diagrams are illustrative of exemplary embodiments of the invention. Also, the connections between various elements may not necessarily be direct and the data transfer in-between can be subjected to encoding, re-formatting, modifications, and so forth.

References in the specification to "one embodiment" or "an embodiment" means that a particular feature, structure, characteristic, or function described in connection with the embodiment is included in at least one embodiment of the invention. The appearances of the phrase "in one embodiment" in various places in the specification are not necessarily all referring to the same embodiment.

Figure 1:
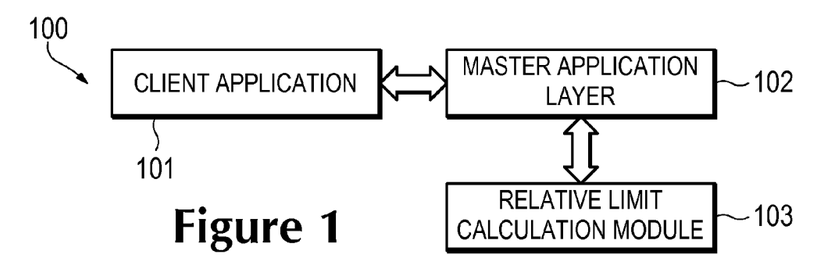
FIG. 1 illustrates a system to measure and represent the measured value of a limit in terms of clock values or cycles of the system, according to an embodiment of the present invention.

FIG. 1 shows a simplified block diagram of a system 100 to enable a user to view various limit calculations in terms of another measurement according to an embodiment of the present invention. For example, the measurements of limits may be done in terms of clock values or cycles.

In one embodiment, the system 100 may be comprised of at least one client application 101 interacting with a layer called the master application layer 102. In one embodiment of the invention, the master layer 102 may be a testing tool that enables a user to perform eye diagram and jitter analysis at the display port. The client application 101 includes logic to communicate the information such as clock rate, etc., to the master application layer 102. The master application layer 102 also provides the necessary infrastructure for a client application 101 to plug-in the implementation for dynamic limits and units.

A relative limit calculation module 103 further interacts with the master application layer 102 to obtain information on input/output parameters dynamically. These are further processed and represented to the user in terms of another measurement such as the clock rate or other value related to the clock.

The method can include various steps such as the following. First, when a particular measurement that needs a dynamic limit is selected, the master application 102 can automatically add the contributing measurements. So, the client application 101 that uses this feature has the knowledge of all the contributing measurements to be added into master application 102.

In a further step, information about the dynamic limits can be displayed to the user on a display device. After the measurement is added, the master application layer 102 results panel can display, for example, a 'Derived . . .' indicator in the limits field. In addition, the user can have access to more information such as 'This limit is calculated based on Measure X' by hovering the mouse pointer over the 'Derived . . . ' indicator. If there is an error in calculating dynamic limits, the limit field can display, for example, an 'Error . . . ' indicator, and by hovering the mouse over the 'Error . . . ' indicator, additional information can be displayed to the user on the display device such as 'This limit is calculated based on Measure X.'

Figure 2:
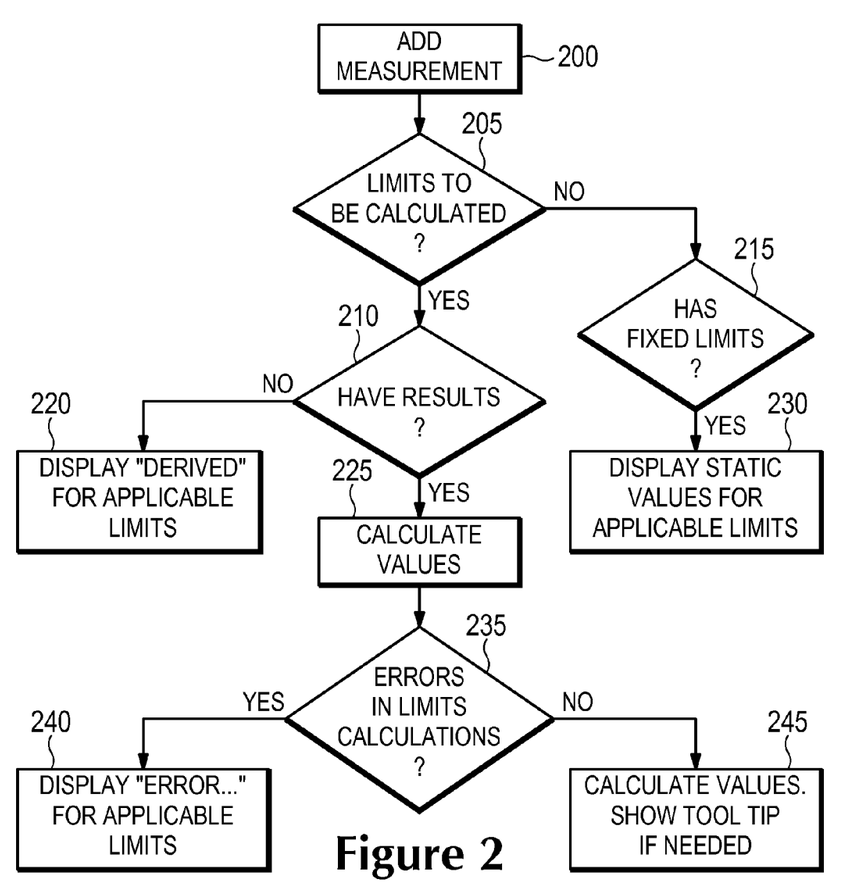
FIG. 2 is a flow diagram illustrating a technique for representing the value of a limit in various forms including showing the value in terms of clock values or cycles of the system, according to some embodiments discussed herein.

FIG. 2 is a flow diagram illustrating a technique for representing the value of a limit in various forms including showing the value in terms of clock values or cycles of the system, according to some embodiments discussed herein. The system can also include logic to obtain information from the one or more client applications 101 attached to the master application layer 102. If the client application 101 attached does not enable measurements of dynamic limits relative to the measured value, the static values of applicable limits can instead be displayed on the display device.

More specifically, at 200, a measurement is added. The flow then proceeds to 205 where a determination is made whether limits are to be calculated. If No, the flow proceeds to 215 and 230 where static values for applicable limits are displayed when the limits are fixed. Otherwise, the flow proceeds to 210 and a determination is made whether the results are available. If No, meaning the results are not available, the flow proceeds to 220 and 'Derived . . . ' is displayed for applicable limits. Otherwise, if Yes, the flow proceeds to 225 and the values are calculated. At 235, a determination is made whether there are errors in the limits calculations. If Yes, the flow proceeds to 240 and 'Error . . . ' for applicable limits is displayed. Otherwise, if no errors, the flow proceeds to 245 and further values are calculated, and if needed, one or more tool tips can be displayed.

Figure 3:
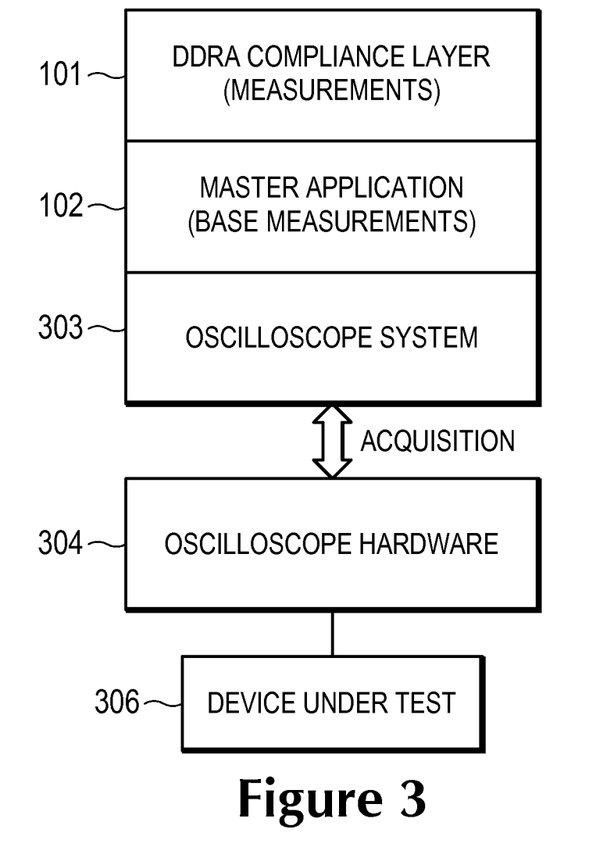
FIG. 3 shows an exemplary application of the method illustrated in FIG. 2, wherein the method is applied specifically to DDR technology.

In an exemplary embodiment as shown in FIG. 3, the method of FIG. 2 is applied specifically to DDR technology. In this embodiment, the oscilloscope system 303 communicates with the oscilloscope hardware 304 to get the acquired data from a device-under-test (DUT) 306. The master application 102, which can include jitter and eye analysis tools such as DPOJET, will analyze the acquired data and produce base measurements. The compliance layer 101, which can include DDR analysis capability such as DDRA for DDR technologies, will use the DPOJET base measurements 102 to produce further measurements. Dynamic limits and units reside in the compliance layer 101.

Figure 4:
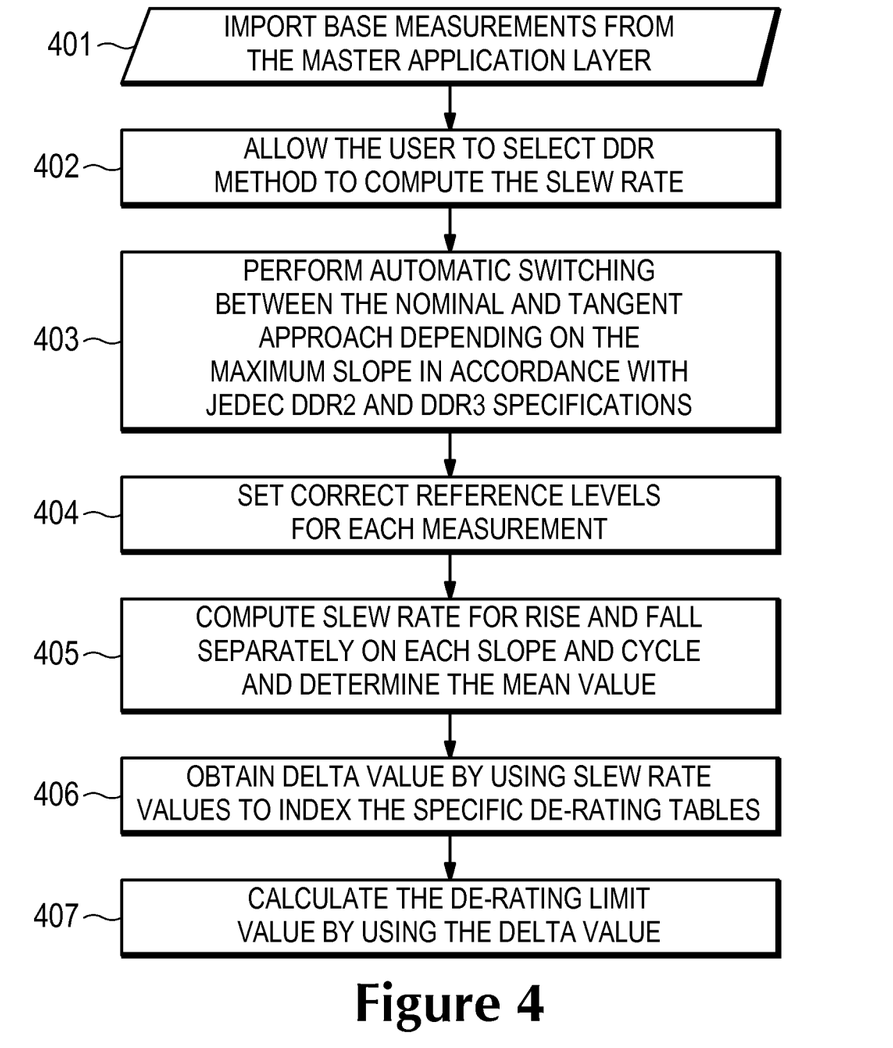
FIG. 4 is a flowchart illustrating a method for determining the slew rate de-rated values, according to some embodiments herein.

FIG. 4 is a flowchart illustrating the method for determining the slew rate de-rated values, according to some embodiments herein.

As explained above, automatic and configurable de-rating tables are provided that help in calculating accurate results. The DDRA is a compliance solution for DDR technology that works with the base measurements of the master application layer. The master application layer is basically a tool for eye-diagram and jitter test analysis. It supports rise, fall slew rate, setup and hold measurements, and their related configurations, which are used to compute slew rate de-rating.

The base measurements of the master application layer are imported at 401. The slew rate technique is configurable in the master application layer. At 402, the user selects DDR technique to compute the slew rate. At 403, automatic switching between the nominal and tangent approach is performed depending on the maximum slope, in accordance with JEDEC DDR2 and DDR3 specifications.

Thereafter, in step 404, correct reference levels for each of these measurements are set. These reference levels are different for single-ended and differential signals. At 405, slew rate for rise and fall are computed separately on each slope and cycle, and the mean value is determined. The mean value of 'n' cycles is used for further processing. The 'n' here represents the number of cycles set by the master application layer. Since both rise and fall slopes are obtained for each cycle, the single slew rate is calculated as average of rise and fall mean values. At 406, a delta value is obtained by using slew rate values to index the specific de-rating tables. Finally, at 407, the de-rating limit value is calculated by using the delta value.

The calculated de-rating limit value may appear as:

$$tDS(\text{total setup time}) = tDS(\text{base}) + \Delta tDS,$$

where the data sheet limit value of tDS(base) is added with the ΔtDS de-rating value taken from the de-rating table as explained above.

In an exemplary embodiment of the present invention, the system may be integrated in an arbitrary waveform generator. The master application layer stores the de-rating table in the oscilloscope installed location. A user can edit the 'x' and 'y' values. For example, 'x' can correspond to slew rate of data strobe (e.g., DQS) and 'y' can correspond to slew rate of data (e.g., DQ). In this way, the application is not tied up with the fixed table. The user can edit the de-rating tables when he/she wants to debug with any other datasheet values or even a change in the specification. Also, the user can run multiple measurements with a 'single' button selection in the application, which enables it to perform the complicated and time consuming de-rated measurements accurately.

Various exemplary reports are shown in FIG. 5, which can be displayed using a display device of the system.

Figure 5A:
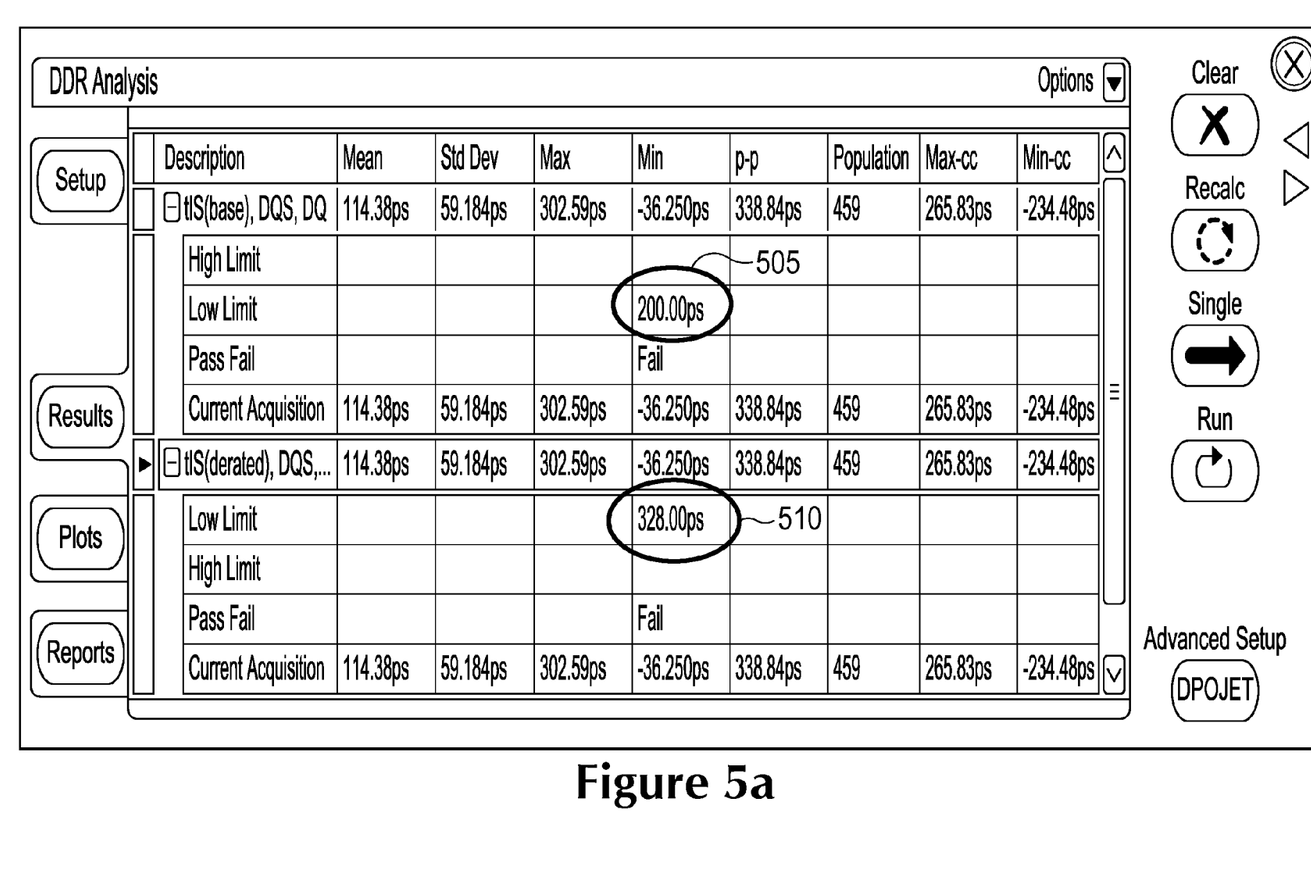
FIG. 5 shows screen displays of various exemplary reports, according to some embodiments of the invention.

In FIG. 5(a), the first measurement is a base measurement which has, for example, 200 ps as the limit as shown at 505. The second measurement, for example, is address and control input total setup time (tIS) de-rated as shown at 510, which has de-rated the limit value.

Figure 5B:
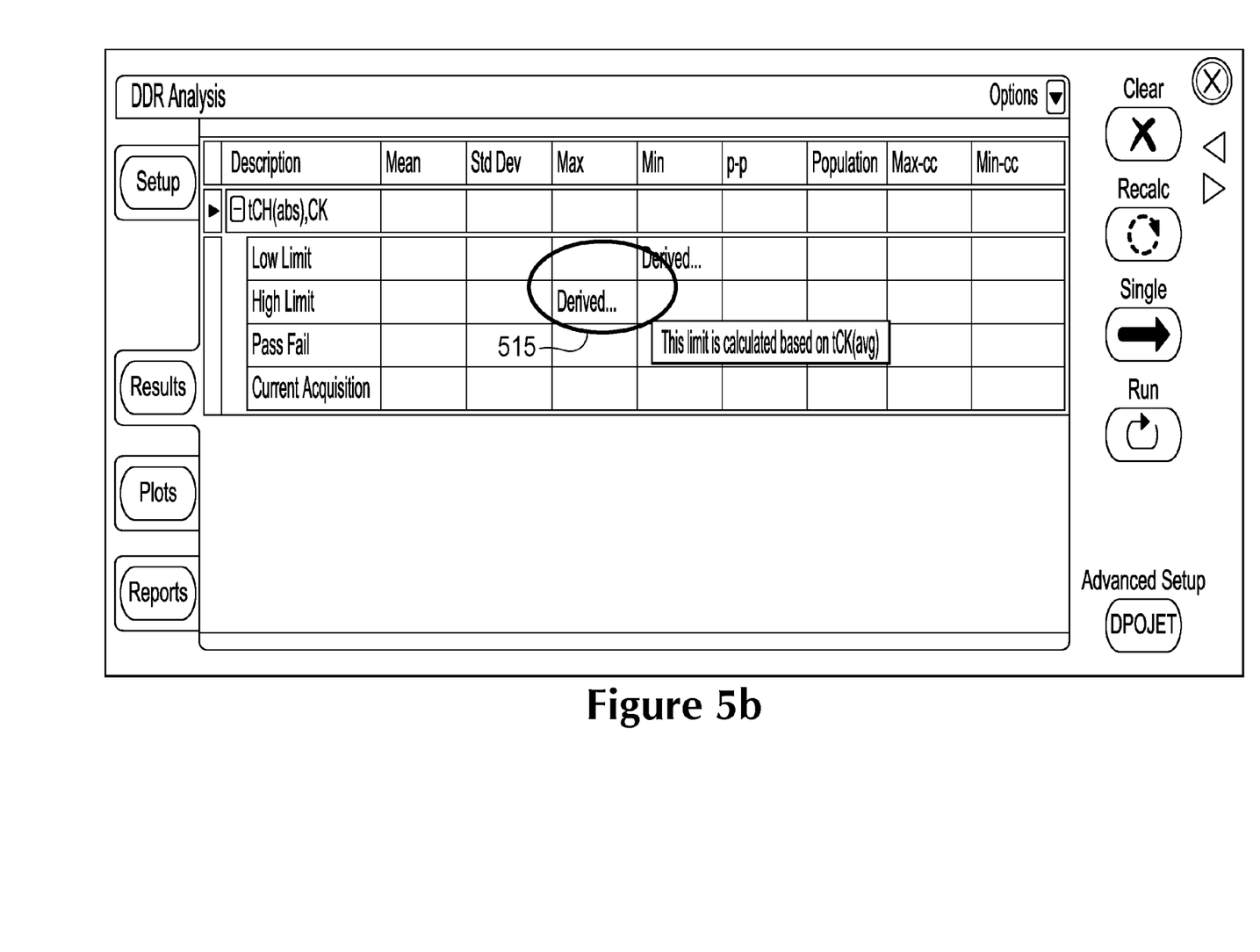

In FIG. 5(b), highlighted portion shows 'Derived . . . ' at 515 for the limits that are dynamic.

Figure 5C:
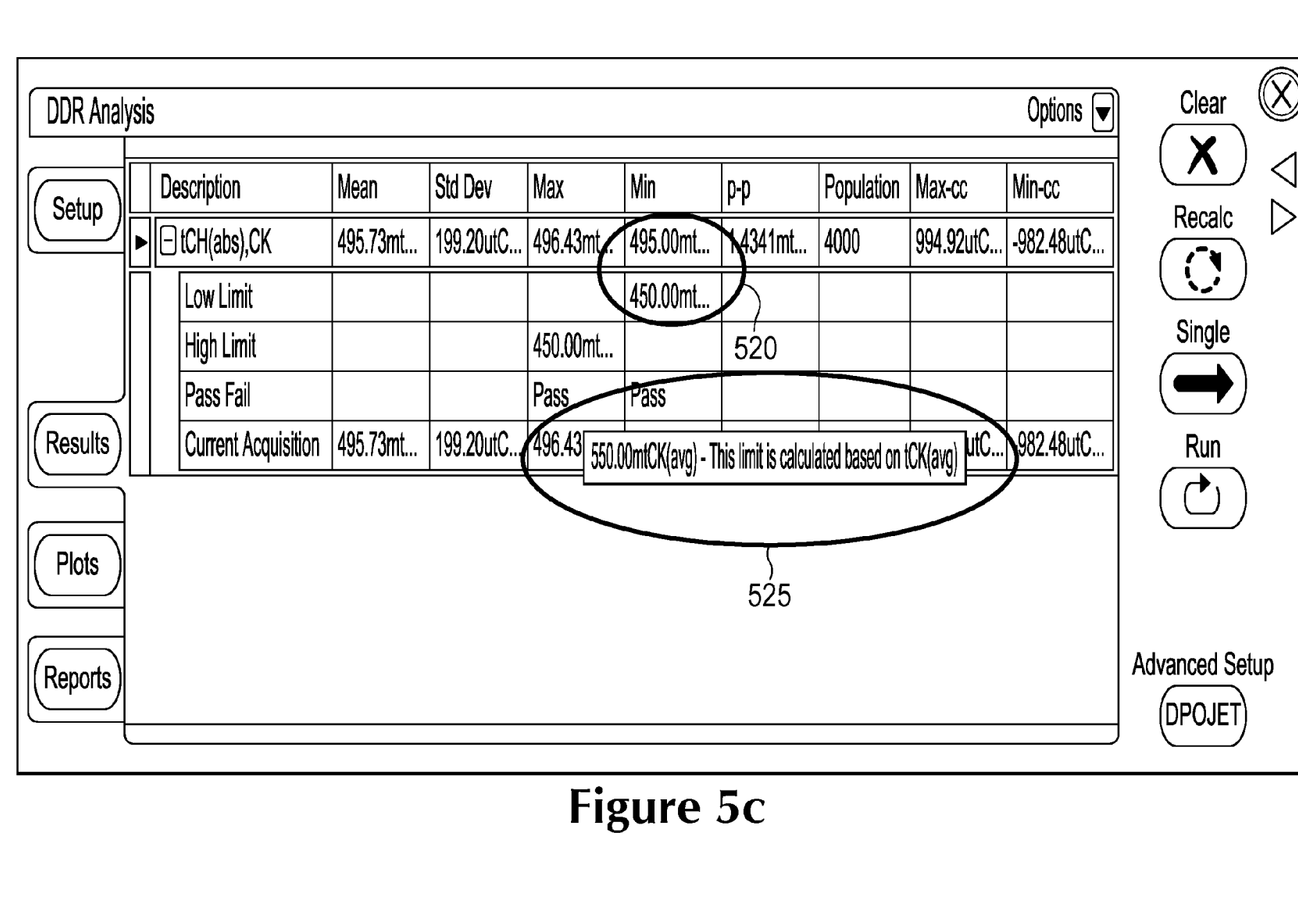

In FIG. 5(c), the highlighted portion at 520 shows the calculated limits, and mouse hover message is shown at 525.

Thus, embodiments of the invention as described above provide a means for automatically obtaining results as scalar de-rating values. Further, the user is not restricted to use the fixed values of the de-rating tables and can change the values based on the particular design's needs.

Moreover, the user is provided with a fully automated suite of measurements having appropriate limits that are calculated on the dynamically based (i.e., pre requisite) measurements.

For situations in which the dependency for a measurement is not another measurement, but rather, input voltage levels (e.g., such as Vdd values), these may be flexibly handled by master-client interfaces. Further, all the measurements and/or parameters that contribute to the dynamic limits may automatically be selected according to the JEDEC standard. The user need not have any prerequisite knowledge.

Furthermore, the user can be made aware which of the limits are dynamically applied, and also the dependent parameters, by looking at the results. This helps the user in getting appropriate information at a glance without running the measurement. Tool tip displays the required information (e.g., such as dependent parameters) to the user before selecting an action button or indicator such as 'Run' or 'Single.'

Although particular embodiments have been described, it will be appreciated that the principles of the invention are not limited to those embodiments. For example, in addition to the oscilloscope hardware described above, the embodiments disclosed herein can be embodied or associated with any type of test and measurement apparatus, and need not be limited to a single system, but can be associated with one or more test and measurement devices. Variations and modifications may be made without departing from the principles of the invention as set forth in the following claims.

The invention claimed is:

1. A non-transitory computer storage device having stored thereon computer executable instructions that, when executed by at least one processor of a computer system, implement a method for automatically determining slew rate de-rating values on signals specific to a user design by providing automatic and configurable de-rating tables, comprising:

an act of a computer system to provide a master application layer that supports measurements including rise, fall, slew rate, setup and hold, and configurations for computing slew rate de-rating;

an act of a computer system to use a configuration tool to configure one or more de-rating tables stored in association with the master application layer;

an act of a computer system to use the master application layer to import base measurements of acquired data from a device under test;

an act of a computer system to provide a user interface configured to allow user selection of a DDR method;

an act of a computer system to compute a slew rate from the base measurements;

an act of a computer system to obtain a delta value by using slew rate values to index a specific de-rating table;

an act of a computer system to calculate a de-rating limit value by using the delta value; and an act of a computer system to send said de-rating limit value back to the master application layer for display, wherein the slew rate is automatically computed for rise and fall separately on each slope and cycle, and a mean slew rate value of 'n' number of cycles is used for further processing, and wherein the master application layer sets the number of cycles 'n'.

2. The method as in claim 1, wherein the master application layer automatically switches between a nominal approach and a tangent approach depending on the maximum slope when a user selects DDR method for determining the slew rate.

3. The method as in claim 1, wherein the master application layer sets up the correct reference levels for each measurement.

4. The method as in claim 1, wherein the slew rate is determined for a plurality of source pair signals, and the slew rate values for each pair are used to index the specific de-rating tables to get the delta value.

5. The method as in claim 1, wherein a calculated de-rating limit value is given as:

$$tDS(\text{total setup time}) = tDS(\text{base}) + \Delta tDS,$$

where the data sheet limit value of tDS(base) is added with the ΔtDS de-rating value taken from the de-rating tables.

6. The method as in claim 1, wherein the master application layer stores the de-rating tables, which are editable at any time by a user.

7. The method as in claim 1, wherein a user can run multiple measurements with a 'single' button selection in the application, thereby efficiently obtaining accurate de-rated measurements.

8. The method as in claim 1, further comprising acquiring information from a device under test using a test and measurement instrument, wherein the information is processed by the master application layer.

* * * * *